United States Patent

Kholodenko et al.

(10) Patent No.: US 6,490,145 B1
(45) Date of Patent: Dec. 3, 2002

(54) SUBSTRATE SUPPORT PEDESTAL

(75) Inventors: Arnold V. Kholodenko, San Francisco, CA (US); You Wang, Cupertino, CA (US); Tony S. Kaushal, Cupertino, CA (US); Semyon L. Kats, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/908,819

(22) Filed: Jul. 18, 2001

(51) Int. Cl.$^7$ ............................................... H01T 23/00
(52) U.S. Cl. ..................................................... 361/234
(58) Field of Search .............................. 361/234, 235; 279/128

(56) References Cited

U.S. PATENT DOCUMENTS

| | | | |
|---|---|---|---|
| 4,551,192 A | 11/1985 | DiMilia et al. | 156/345 |
| 5,117,121 A | 5/1992 | Watanabe et al. | 307/130 |
| 5,207,437 A | 5/1993 | Barnes et al. | 279/128 |
| 5,267,607 A | 12/1993 | Wada | 165/80.1 |
| 5,324,053 A | 6/1994 | Kubota et al. | 279/128 |
| 5,350,479 A | 9/1994 | Collins et al. | 156/345 |
| 5,382,311 A | 1/1995 | Ishikawa et al. | 156/345 |
| 5,413,360 A | 5/1995 | Atari et al. | 279/128 |
| 5,463,526 A | 10/1995 | Mundt | 361/234 |
| 5,522,131 A | 6/1996 | Steger | 29/829 |
| 5,530,616 A | 6/1996 | Kitabayashi et al. | 361/234 |
| 5,539,179 A | 7/1996 | Nozawa et al. | 219/121.58 |
| 5,583,736 A | 12/1996 | Anderson et al. | 361/234 |
| 5,656,093 A | 8/1997 | Burkhart et al. | 118/728 |
| 5,720,818 A | 2/1998 | Donde et al. | 118/500 |
| 5,792,562 A | 8/1998 | Collins et al. | 428/463 |
| 5,903,428 A | 5/1999 | Grimard et al. | 361/234 |
| 5,904,776 A | 5/1999 | Donde et al. | 118/500 |
| 5,909,355 A | 6/1999 | Parkhe | 361/234 |
| 6,122,159 A | 9/2000 | Arai et al. | 361/234 |

OTHER PUBLICATIONS

Burkhart "Conductive Feedthrough for a Ceramic Body and Method of Fabricating Same" U.S. patent application, Ser. No. 08/834,702, filed Apr. 4, 1997.

Primary Examiner—Edward H. Tso
(74) Attorney, Agent, or Firm—Moser, Patterson, Sheridan; Joseph Bach

(57) ABSTRACT

A ceramic substrate support and methods for fabricating the same are provided. In one embodiment, a ceramic substrate support for supporting a substrate includes a ceramic body and a porous member disposed therein. The ceramic body generally has an upper portion and a lower portion. The upper portion includes a support surface while the lower portion includes a bottom surface. At least one passage is disposed in the lower portion of the ceramic body. A first end of the passage is at least partially closed by the upper portion of the ceramic body. At least one outlet is disposed through the portion of the ceramic body through the upper portion of the ceramic body and fluidly couples the passage to the support surface.

40 Claims, 3 Drawing Sheets

SUBSTRATE SUPPORT PEDESTAL

CROSS REFERENCE TO OTHER RELATED APPLICATIONS

This application is related to commonly assigned U.S. patent application Ser. No. 09/907,328, filed Jul. 16, 2001 by Kholodenko, et al.

BACKGROUND OF THE DISCLOSURE

1. Field of Invention

The embodiments of the invention generally relate to a ceramic support for supporting a substrate in a process chamber.

2. Background of the Invention

Substrate support chucks are widely used to support substrates within semiconductor processing systems. A particular type of chuck used in semiconductor processing systems, such as etch systems among other processing systems, is a ceramic electrostatic chuck. Electrostatic chucks generally retain a substrate or other workpiece in a stationary position during processing. Typically, electrostatic chucks contain one or more embedded electrodes within a ceramic body. As an electrical potential is applied between the electrodes and a substrate disposed on the ceramic body, an electrostatic attraction is generated which holds the substrate against a support surface of the ceramic body. The force generated may be a capacitive effect due to a potential difference between the substrate and the electrodes or, in the case of ceramic bodies comprised of semiconducting materials having a relatively low resistivity which allow charge migration within the ceramic body to the surface approximate the substrate, a Johnsen-Rahbeck effect. Electrostatic chucks utilizing capacitive and Johnsen-Rahbeck attractive forces are commercially available from a number of sources.

Typically, to control the substrate temperature during processing, a backside gas is provided between the support surface of the ceramic body and the substrate. Generally, the backside gas fills the interstitial area between the ceramic body and the substrate, thus providing a heat transfer medium that enhances the rate of heat transfer between the substrate and the substrate support.

The operation and service life of the electrostatic chuck may be adversely affected if backside gas becomes ignited into a plasma or facilitates arcing between the substrate and the substrate support. Arcing or the creation of plasma between the substrate and the wafer may damage both the substrate and the support surface of the electrostatic chuck. In particular, backside gas outlets disposed in the support surface are vulnerable to erosion or damage due to the concentration of gas flowing therethrough which provides a less resistive current path than the surrounding gas in the interstitial area.

One configuration of an electrostatic chuck that substantially reduces arcing and plasma discharge around the backside gas outlets disposed in the support surface includes a porous dielectric plug inserted in the outlet. The porous material blocks the direct electrical path between the backside of the substrate and the interior portions of the backside gas channel which are closer to the embedded conductive member (e.g., the electrodes). Moreover, the porous flow path provides less surface area surrounding the individual backside gas flows through the plug resulting in less charge accumulation proximate the gas flow. As less charge accumulation results in a lower potential at the outlets, arcing and gas ignition are substantially eliminated. Thus, the backside gas may flow to interstitial space between the substrate and the support surface through the porous material substantially without risk of damage to the chuck and/or substrate.

While the porous material provides good protection against plasma ignition and arcing at the backside gas outlets, fabrication of such chucks is difficult. For example, the porous plugs are typically inserted into a counterbore provided in the support surface and concentric with the backside gas outlet and retained therein using an adhesive. As a plurality of backside gas outlets are typically disposed in one electrostatic chuck, the fabrication steps of applying adhesive and inserting the plugs into the electrostatic chuck is timeconsuming and expensive. Moreover, such chucks having an adhesive bond exposed to the support surface risk chamber contamination during various portions of the processing cycle, particularly during plasma dry cleaning. During plasma dry cleaning, the portions of the adhesive exposed to the plasma may be removed from the plug to ceramic body joint and deposited elsewhere in the chamber, thereby becoming a potential substrate contamination source. Additionally, after a number of cleanings, the plug may become loose and eventually become disengaged from the chuck. Loose plugs are a source of unwanted particle contamination and may also come in contact with the substrate thus damaging the substrate.

Other electrostatic chucks utilizing porous plugs include a dielectric layer deposited over the chuck body after the porous inserts have been deposited in the outlet passages. In order to complete the backside gas flow path to the interstitial area after the deposition of the dielectric material, a passage must be fabricated in the dielectric coupling the plug to the surface of the dielectric material.

Although chucks configured in this manner are more conducive to plasma cleaning, fabrication and other concerns exist. For example, the fabrication of the electrostatic chuck now includes both a subsequent dielectric deposition and machining step. As the plugs are typically inserted without the use of adhesives, inconsistencies between the height of the porous plug and the support surface may result in variations in the topography of the applied dielectric layer. Moreover, if the plug moves away from the applied dielectric layer leaving a gap, gas within the gap is susceptible to plasma ignition. Furthermore, if the plug is loose and moves within the electrostatic chuck, particle generation may occur. Thus, the high fabrication costs along with the remaining possibility of plasma ignition within the passages utilized by the backside gas and the difficulty of maintaining a flat support surface leaves room for improvement in electrostatic chuck design.

Therefore, there is a need for an improved electrostatic chuck along with methods for fabricating the same.

SUMMARY OF THE INVENTION

One aspect of the invention generally provides a ceramic substrate support for supporting a substrate. In one embodiment, a ceramic substrate support includes a ceramic body and a porous member disposed therein. The ceramic body generally has an upper portion and a lower portion. The upper portion includes a support surface while the lower portion includes a bottom surface. At least one passage is disposed in the lower portion of the ceramic body. A first end of the passage is at least partially closed by a portion of the upper portion of the ceramic body. At least one outlet is disposed through the portion of the upper portion of the ceramic body closing the passage and fluidly couples the passage to the support surface.

In another embodiment, a ceramic substrate support for supporting a substrate includes a ceramic body having one or more conductive members and a porous ceramic member disposed therein. The ceramic body has an upper portion having a support surface and a lower portion having a bottom surface. At least one passage is disposed in the lower portion of the ceramic body. A first end of the passage is at least partially closed by the upper portion. At least one outlet is disposed through the upper portion of the ceramic body and fluidly couples the passage to the support surface. The porous ceramic member is disposed within the passage and sintered and processed to become a single member with the ceramic body.

In another aspect of the invention, a process chamber for processing a substrate includes an evacuable chamber having an interior volume having a gas supply fluidly coupled thereto and an electrostatic chuck disposed in the interior volume. The electrostatic chuck includes a ceramic body having one or more conductive members and a porous member disposed therein. The ceramic body has an upper portion having a support surface and a lower portion having a bottom surface. At least one passage is disposed in the lower portion of the ceramic body. A first end of the passage is at least partially closed by the upper portion. At least one outlet is disposed through the upper portion of the ceramic body and fluidly couples the passage to the support surface.

In another aspect of the invention, a method for fabricating a ceramic substrate support is provided. In one embodiment, a method for fabricating a ceramic substrate support includes the steps of forming one or more blind holes on a first side of a first ceramic member, inserting a porous ceramic member in each blind hole, disposing a second ceramic member on the first side of the first ceramic member and processing the first ceramic member, second ceramic member and porous ceramic member to form a single ceramic body.

In another embodiment, a method for fabricating a ceramic substrate support pedestal includes forming one or more blind holes in a first side of a first ceramic member having a resistivity between 1×E9 to about 1×E11 ohms-cm, inserting a porous ceramic member in each of the blind holes, disposing a second ceramic member having a resistivity higher than the first ceramic member on the first side of the first ceramic member, disposing one or more electrodes between the first ceramic member and the second ceramic member, processing the first ceramic member, the second ceramic member and the porous ceramic member to form a single ceramic body and forming one or more outlets in the first ceramic member to couple each blind hole to a second side of the first ceramic member.

BRIEF DESCRIPTION OF DRAWINGS

So that the manner in which the above recited features of the present invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION

Generally, a process chamber having a ceramic substrate support disposed therein is provided. The ceramic substrate support generally includes a porous member disposed in a backside gas passage that substantially minimizes arcing and plasma ignition at the gas outlets of the ceramic substrate support. Although one embodiment of a ceramic substrate support is described illustratively in a Decoupled Plasma Source (DPS) CENTURA® etch system available from Applied Materials, Inc. of Santa Clara, Calif., the invention has utility in other process chambers including physical vapor deposition chambers, chemical vapor deposition chambers, other etch chambers and other applications where backside gas temperature control of a substrate is desired.

Figure 1:
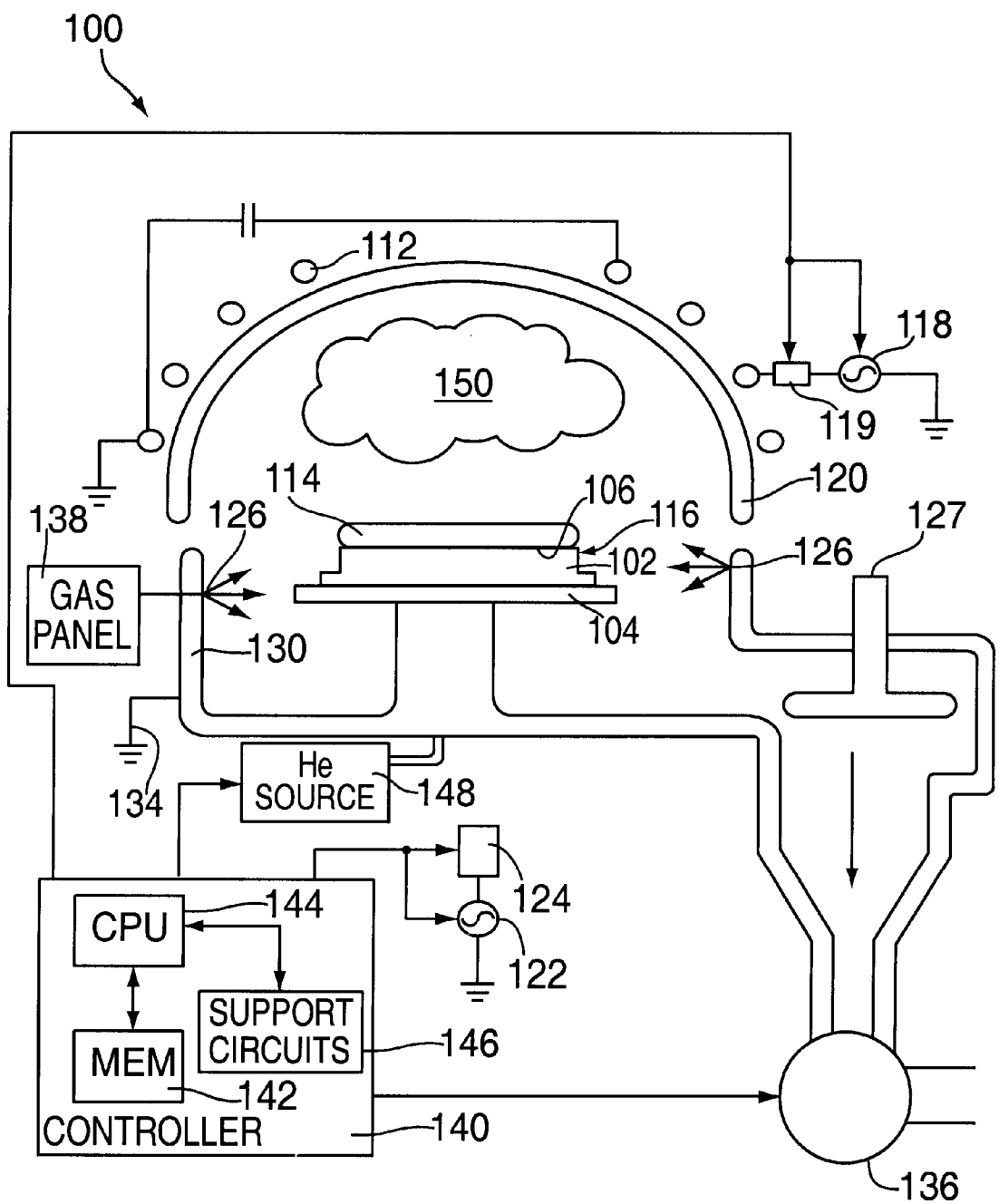
FIG. 1 depicts a schematic of a processing chamber having one embodiment of an electrostatic chuck disposed therein.

FIG. 1 depicts a schematic diagram of a DPS etch process chamber 100 that comprises at least one inductive coil antenna segment 112 positioned exterior to a dielectric, dome-shaped ceiling 120 (referred to hereinafter as the dome 120). An example of a process chamber that may be adapted to benefit from the invention is described in U.S. Pat. No. 5,583,737 issued Dec. 10, 1996 to Collins et al., which is hereby incorporated by reference in its entirety.

The antenna segment 112 is coupled to a first radio-frequency (RF) source 118 that is generally capable of producing an RF signal. The RF first source 118 is coupled to the antenna 112 through a matching network 119. Process chamber 100 also includes a substrate support pedestal 116 that is coupled to a second RF source 122 that is generally capable of producing an RF signal. The source 122 is coupled to the pedestal 116 through a matching network 124. The chamber 100 also contains a conductive chamber wall 130 that is connected to an electrical ground 134. A controller 140 comprising a central processing unit (CPU) 144, a memory 142, and support circuits 146 for the CPU 144 is coupled to the various components of the process chamber 100 to facilitate control of the etch process.

In operation, the semiconductor substrate 114 is placed on the substrate support pedestal 116 and gaseous components are supplied from a gas panel 138 to the process chamber 100 through entry ports 126 to form a gaseous mixture 150. The gaseous mixture 150 is typically ignited into a plasma in the process chamber 100 by applying RF power from the RF sources 118 and 122 respectively to the antenna 112 and the pedestal 116. The pressure within the interior of the etch chamber 100 is controlled using a throttle valve 127 situated between the chamber 100 and a vacuum pump 136. The temperature at the surface of the chamber walls 130 is controlled using liquidcontaining conduits (not shown) that are located in the walls 130 of the chamber 100. Chemically reactive ions are released from the plasma and strike the substrate; thereby removing exposed material from the substrate's surface.

The pedestal 116 generally comprises an electrostatic chuck 102 disposed on a temperature control plate 104. The temperature of the substrate 114 is controlled by stabilizing the temperature of the electrostatic chuck 102 and flowing helium or other gas from a gas source 148 to a plenum defined between the substrate 114 and a support surface 106 of the electrostatic chuck 102. The helium gas is used to facilitate heat transfer between the substrate 114 and the pedestal 116. During the etch process, the substrate 114 is gradually heated by the plasma to a steady state temperature. Using thermal control of both the dome 120 and the pedestal 116, the substrate 114 is maintained at a predetermined temperature during processing.

Figure 2:
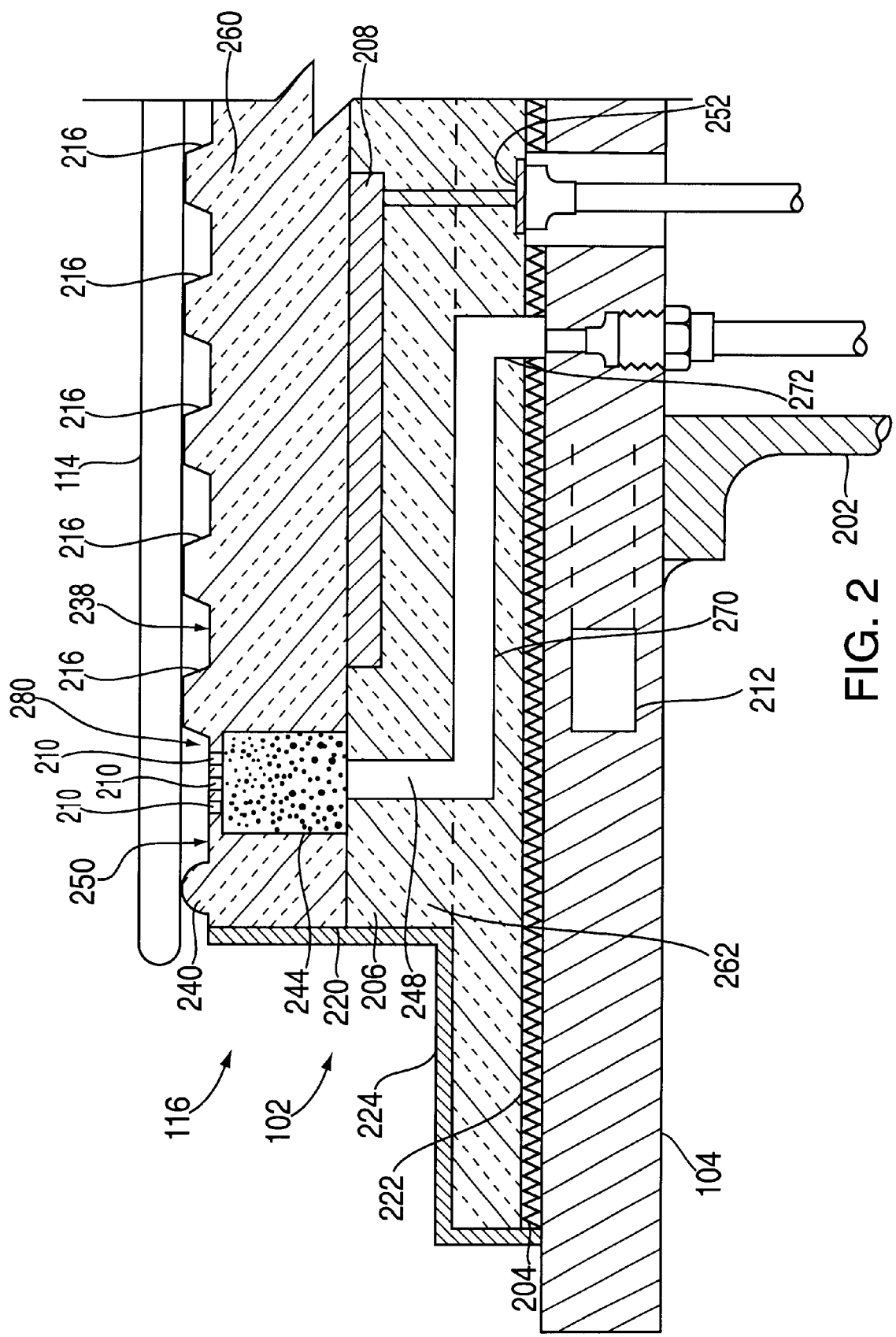
FIG. 2 depicts a partial sectional view of the electrostatic chuck of the electrostatic chuck of FIG. 1.

FIG. 2 depicts a vertical cross-sectional view of a first embodiment of the pedestal 116. The pedestal 116 is generally comprised of the temperature control plate 104 and the electrostatic chuck 102. The pedestal 116 is generally supported above the bottom of the chamber 100 by a shaft 202 coupled to the temperature control plate 104. The shaft 202 is typically welded, brazed or otherwise sealed to the temperature control plate 104 to isolate various conduits and electrical leads disposed therein from the process environment within the chamber 100.

The temperature control plate 104 is generally comprised of a metallic material such as stainless steel or aluminum alloys. The temperature control plate 104 typically includes one or more passages 212 disposed therein that circulate a heat transfer fluid to maintain thermal control of the pedestal 116. Alternatively, the temperature control plate 104 may include an external coil, fluid jacket, thermoelectric device or other heat transfer device to provide temperature control.

The temperature control plate 104 may be screwed, clamped, adhered or otherwise fastened to the electrostatic chuck 102. In one embodiment, a heat transfer enhancing layer 204 is adhered between the temperature control plate 104 and the electrostatic chuck 102 thereby securing the plate 104 to the chuck 102. The heat transfer enhancing layer 204 is comprised of a number of thermally conductive materials and composites, including but not limited to conductive pastes, brazing alloys and adhesive coated, corrugated aluminum films.

The electrostatic chuck 102 is generally circular in form but may alternatively comprise other geometries to accommodate non-circular substrates, for example, square or rectangular substrate such as flat panels. The electrostatic chuck 102 generally includes one or more electrodes 208 embedded within a support body 206. The electrodes 208 are typically comprised of an electrically conductive material such as copper, graphite, tungsten, molybdenum and the like. Typical electrode structures include, but are not limited to, a pair of coplanar D-shaped electrodes, coplanar interdigital electrodes, a plurality of coaxial annular electrodes, a singular, circular electrode or other structure. The electrodes 208 are coupled to the second RF source 122 by a feed through 252 disposed in the pedestal 116. One feed through that may be adapted to benefit from the invention is described in copending and commonly assigned U.S. patent application Ser. No. 08/834,702, filed Apr. 4, 1997 by Burkhart, which is hereby incorporated by reference in its entirety.

The body 206 may comprise aluminum, ceramic, dielectric or a combination of one or more of the aforementioned materials. In one embodiment, the chuck body 206 is fabricated from a low resistivity ceramic material (i.e., a material having a resistivity between about $1 \times E^9$ to about $1 \times E^{11}$ ohm-cm). Examples of low resistivity materials include doped ceramics such as alumina doped with titanium oxide or chromium oxide, doped aluminum oxide, doped boron-nitride and the like. Other materials of comparable resistivity, for example, aluminum nitride, may also be used. Such ceramic materials having relatively low resistivity generally promote a Johnsen-Rahbek attractive force between the substrate and electrostatic chuck 102 when power is applied to the electrodes 208. Alternatively, chuck body 206 comprising ceramic materials having resistivities equal to or greater than 1E×11 ohms-cm may also be used.

In the embodiment depicted in FIG. 2, the electrostatic chuck 102 generally includes an optional dielectric coating 224 disposed on at least one of the sides 220 and support surface 238 or bottom 222 of the chuck body 206. Generally, the dielectric coating 224 has a substantially higher resistivity (or lower dielectric constant) than the material comprising the chuck body 206. In one embodiment, the coating 224 is an electrically insulating material having a dielectric constant in the range of about 2.5 to about 7. Examples of such insulating materials include, but are not limited to, silicon nitride, silicon dioxide, aluminum oxide, tantalum pentoxide, silicon carbide, polyimide and the like. The high surface or contact resistivity between the body 206 and the coating 224 substantial prevents electrons from passing therebetween. Moreover, the low dielectric constant of the coating 224 electrically insulates the chuck body 206 from the surrounding structure and environment (e.g., the temperature control plate 104, process gases, plasma and other conductive pathways) thus minimizing parasitic electrical losses that may reduce the electrical potential between the electrostatic chuck 102 and the substrate thereby resulting in reduction in the attractive forces.

The coating 224 may be applied to the chuck body 206 using a variety of methods including adhesive film, spraying, encapsulation and other methods that coat one or more of the outer surfaces of the body 206. In one embodiment, the coating 224 is integrally fabricated to the body 206 by plasma spraying or by sputtering. Alternatively, when the coating 224 comprises a ceramic material, the coating 224 may be sintered or hot-pressed to the body 206 creating a single, monolithic ceramic member.

In the embodiment depicted in FIG. 2, the support surface 106 of the chuck body 206 may include a plurality of mesas 216 disposed inwards of a seal ring 240 formed on the support surface 106. The seal ring 240 is typically comprised of the same material comprising the chuck body 206 but may alternatively be comprised of other dielectric materials. The mesas 216 are generally formed from one or more layers of an electrically insulating material having a dielectric constant in the range of about 5 to about 10. Examples of such insulating materials include, but are not limited to, silicon nitride, silicon dioxide, aluminum oxide, tantalum pentoxide, polyimide and the like. Alternatively, the mesas 216 may be formed from the same material as the chuck body and then coated with a high resistivity dielectric film.

In an embodiment of the chuck 102 utilizing the Johnson-Rahbeck effect, the ceramic chuck body 206 is partially conductive due to the relatively low resistivity of the ceramic thus allowing charges to migrate from the electrode 208 to the surface 106 of the chuck body 206. Similarly, charges migrate through the substrate 114 and accumulate on the substrate 114. The insulating material comprising or coating the mesas 216 prevents current flow therethrough. Since each of the mesas 216 has a significantly higher resistivity (i.e. lower dielectric constant) than the chuck body 206, the migrating charges accumulate proximate each of the mesas 216 on the surface 106 of the chuck 102. Although charges also migrate to the portions of the surface 106 between mesas 216, the dielectric constant of the mesa 216 is substantially greater than the dielectric constant of the backside gas between the backside of the substrate 114 and the chuck body surface which results in the electric field being substantially greater at each mesa 216 than at locations alongside the mesas. Consequently, the clamping force is greatest at each mesa 216 and the invention enables the clamping force to be strictly controlled by placement of the mesas to achieve a uniform charge distribution across the backside of the substrate. One electrostatic chuck having mesas disposed on a support surface that may be adapted to benefit from the invention is described in U.S. Pat. No. 5,903,428 issued May 11, 1999 to Grimard et al., which is hereby incorporated by reference in its entirety.

To promote a uniform temperature across a substrate that is retained by the electrostatic chuck, gas (e.g., helium, nitrogen or argon) provided by the source 148 is introduced to a plenum 280 defined inward of the seal ring 240 between the support surface 106 of the electrostatic chuck 102 and the substrate 114 to provide a heat transfer medium therebetween. The backside gas is generally applied to the plenum 280 through one or more outlets 210 formed through the support surface 238 of the chuck body 206.

The outlets 210 are generally coupled to one or more passages 248 disposed through the chuck body 206 that are coupled to the gas source 148. Generally, each passage 248 is coupled to channel 270 that terminates at a common port 272 that is coupled to the gas source 148. The channel 270 may be disposed within the body 206 or defined between the electrostatic chuck 102 and the plate 104.

A porous plug 244 is generally disposed adjacent the outlets 210 within the passage 248. The porous plug 244 is generally comprised of a ceramic material such as aluminum oxide or aluminum nitride. In one embodiment, the porous plug 244 has a porosity of about 40 to about 80 percent.

The porous plug 244 may be disposed in the chuck body 206 in various configurations. The passage 248 is generally a blind hole may extend from the bottom 222 of the chuck body 206 to within about 1 mm of the support surface 238. The porous plug 244, which typically has a diameter of less than about 4 mm and preferably about 3 mm, may be inserted into the passage 248 from the bottom 222 of the body 206 until the plug abuts a portion 250 of the support surface 238 covering the passage 248. The porous plug 244, which is substantially equal in diameter to the passage 248, may be held in place by press fit, retaining ring, adhesive or by hot pressing or sintering the plug 244 into a singular body with the chuck body 206.

In another embodiment, the chuck body 206 may comprise a includes an upper portion 260 disposed on a lower portion 262. The lower portion 262 is coupled to a temperature control plate 104 and is generally comprised of a ceramic having a resistivity higher than a resistivity of the upper portion 260. One or more of the electrodes 208 are disposed between the upper and lower portions 260, 262 of the body 206. Alternatively, the electrodes 208 may be disposed on or in either the upper or lower portions 260, 262.

Figure 3:
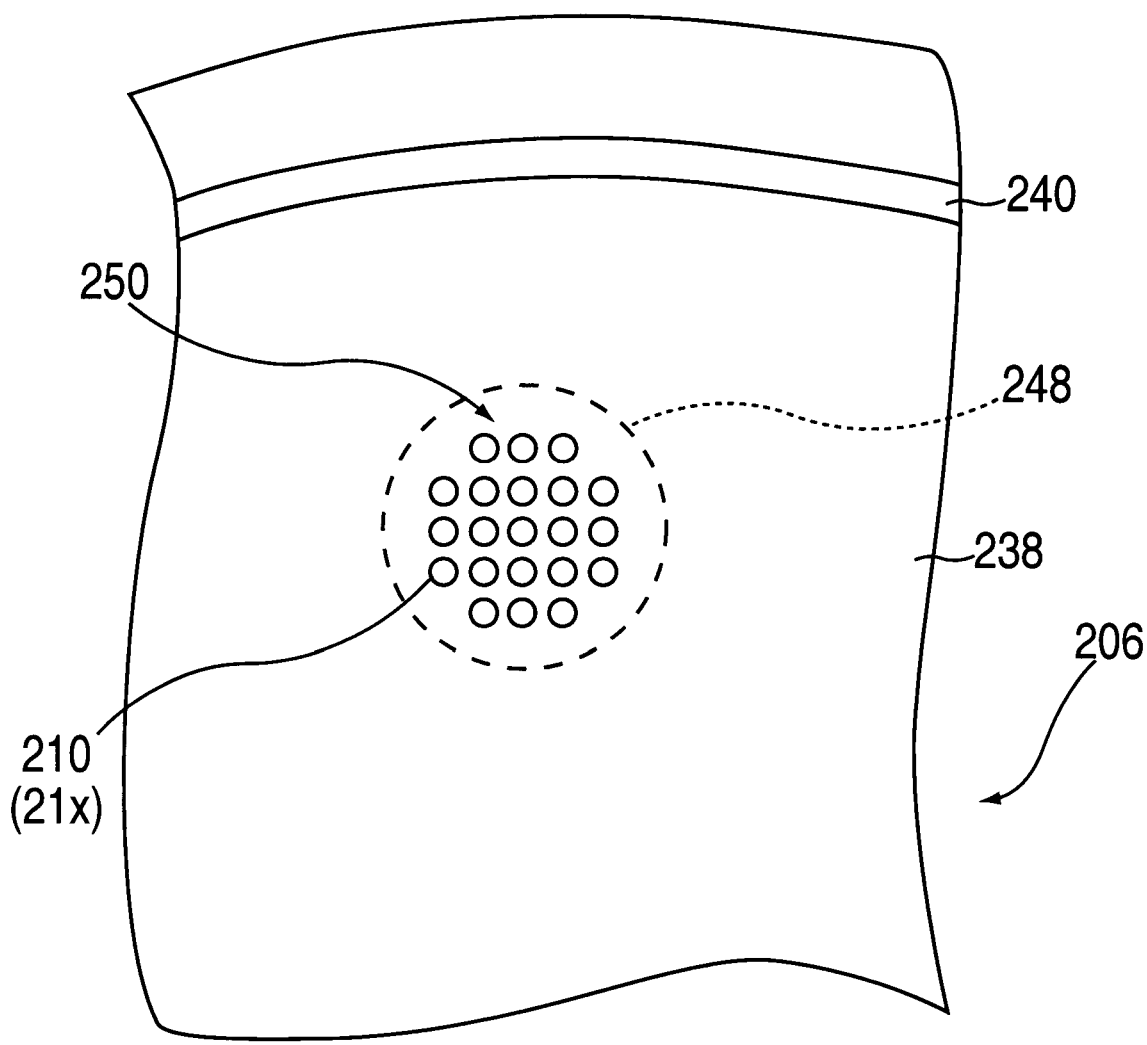
FIG. 3 depicts a partial plan view of the electrostatic chuck of FIG. 2.

In the embodiment shown in FIG. 3, the upper portion 260 is disposed over the lower portion 262, thus encapsulating the electrodes 208. The upper portion 260 of the chuck body 206 is generally comprised of a low resistivity ceramic. As power is supplied to the electrodes 208, the low resistivity material comprising the upper portion 260 of the body 206 allows charge migration therethrough, thus establishing a Johnson-Rahbeck attraction force with a substrate 114 disposed on the support surface 238. The higher resistivity material of the lower portion 262 substantially insulates the sides 220 and bottom 220 of the chuck body 206, thus minimizing potential current leakage through those areas.

The porous plug 244 is generally positioned in a portion of the passage 248 disposed the upper portion 260 of the chuck body 206 while in the green state. The plug 244, the electrodes 208 and the upper and lower portions 260, 262 of the body 206 are typically hot-pressed or sintered into a single monolithic ceramic member.

The outlets 210 are disposed through the portion 250 of the support surface 238 covering the porous plug 244. The outlets 210 may be formed in the chuck body 206 prior to or after the installation of the plug 244. Generally, the porous plug 244 prevents arcing and plasma ignition of the backside gas during processing and plasma cleaning by blocking a direct current path through the backside gas between the substrate and portions of the chuck 102 in the passage 248 proximate the electrodes 208 while minimizing the surface area available for charge accumulation adjacent the backside gas flow path.

FIG. 3 depicts a partial plan view of one embodiment of an electrostatic chuck 102 having a plurality of outlets 210 disposed in the support surface 138. Generally, the number and diameter of the outlets 210 are selected to provide the desired flow of the backside gas to the plenum. In embodiment shown in FIG. 3, about 8 to about 21 laser drilled outlets 210 having a diameter of about 2 to about 4 mils are disposed through the portion 250 of the support surface 238 above each passage 248.

Although various embodiments which incorporate the teachings of the present invention have been shown and described in detail herein, those skilled in the art can readily devise many other varied embodiments that still incorporate these teachings.

What is claimed:

1. A substrate support for supporting a substrate comprising:
   a ceramic body having an upper portion and a lower portion, the upper portion having a support surface and the lower portion having bottom surface;
   at least one passage disposed in the lower portion of the ceramic body and having a first end at least partially closed by a portion of the upper portion;
   at least one outlet disposed through the portion of the upper portion closing the passage and fluidly coupling the passage to the support surface; and
   a porous member disposed within the passage.

2. The substrate support of claim 1, wherein the porous member and ceramic body are co-fired, hot pressed or sintered into a single member.

3. The substrate support of claim 1, wherein at least a portion of the ceramic body is comprised of a ceramic material having a resistivity between about 1×E9 and about 1×E11.

4. The substrate support of claim 1, wherein the lower portion of the ceramic body has a higher resistivity than the upper portion.

5. The substrate support of claim 1, wherein the porous member is dielectric.

6. The substrate support of claim 1, wherein the porous member is ceramic.

7. The substrate support of claim 6, wherein the porous member comprises aluminum nitride or aluminum oxide.

8. The substrate support of claim 1, wherein the porous member has a diameter of less than about 4 mm.

9. The substrate support of claim 1, wherein the outlet has a diameter of about 2 to about 4 mils.

10. The substrate support of claim 9, wherein each passage has about 8 to about 21 outlets coupled thereto.

11. The substrate support of claim 1, wherein the upper portion of the ceramic body has a resistivity between about 1×E9 to 1×E11 ohm-cm.

12. The substrate support of claim 11, wherein the lower portion of the ceramic body has a resistivity higher than the upper portion.

13. The substrate support of claim 1 further comprising a dielectric coating disposed on at least one side of the ceramic body.

14. A substrate support for supporting a substrate comprising:
   a ceramic body having an upper portion and a lower portion, upper portion having a support surface and the lower portion having bottom surface;
   one or more conductive members disposed in the ceramic body;
   at least one passage disposed in the lower portion of the ceramic body and having a first end at least partially closed by the upper portion;
   at least one outlet disposed through the upper portion of the ceramic body and fluidly coupling the passage to the support surface; and
   a porous ceramic member disposed within the passage and processed to become a single member with the ceramic body.

15. The substrate support of claim 14, wherein the porous member and ceramic body are processed by co-firing, hot pressing and/or sintering.

16. The substrate support of claim 14, wherein at least a portion of the ceramic body is comprised of a ceramic material having a resistivity between about 1×E9 and about 1×E11.

17. The substrate support of claim 14, wherein the porous member has a diameter of less than about 4 mm.

18. The substrate support of claim 14, wherein the outlet has a diameter of about 2 to about 4 mils.

19. The substrate support of claim 18, wherein each passage includes about 8 to about 21 outlets coupled thereto.

20. The substrate support of claim 14, wherein the upper portion of the ceramic body has a resistivity between about 1×E9 to 1×E11 ohm-cm.

21. The substrate support of claim 14, wherein the lower portion of the ceramic body has a resistivity higher than the upper portion.

22. The substrate support of claim 14 further comprising a dielectric coating disposed on at least one side of the ceramic body.

23. A process chamber for processing a substrate comprising:
   an evacuable chamber defining an interior volume;
   a gas supply fluidly coupled to the interior volume;
   an electrostatic chuck disposed in the interior volume, the electrostatic chuck comprising:
      a ceramic body having an upper portion and a lower portion, upper portion having a support surface and the lower portion having bottom surface;
      one or more conductive members disposed in the ceramic body;
      at least one passage disposed in the lower portion of the ceramic body and having a first end at least partially closed by the upper portion;
      at least one outlet disposed through the upper portion of the ceramic body and fluidly coupling the passage to the support surface; and
      a porous member disposed within the passage.

24. The process chamber of claim 23, wherein the co-fired, hot pressed, sintered into a single member.

25. The process chamber of claim 23, wherein the ceramic body is aluminum nitride or aluminum oxide.

26. The process chamber of claim 23, wherein the ceramic body has a resistivity of between about 1×E9+1×E11 ohms-cm.

27. The process chamber of claim 23, wherein the porous member is dielectric.

28. The process chamber of claim 23, wherein the porous member is ceramic.

29. The process chamber of claim 28, wherein the porous member is aluminum oxide or aluminum nitride.

30. The process chamber of claim 23, wherein the wherein the porous member has a diameter of about 2 to about 4 mils.

31. The process chamber of claim 23, wherein the wherein the outlet has a diameter of about 2 to about 4 mils.

32. The process chamber of claim 31, wherein each passage includes about 8 to about 12 outlets coupled thereto.

33. The process chamber of claim 23 further comprising a plate coupled to the bottom surface of the ceramic body.

34. A method of fabricating a ceramic substrate support pedestal comprising:
   forming one or more blind holes on a first side of a first ceramic member;
   inserting a porous ceramic member in each of the blind holes;
   disposing a second ceramic member on the first side of the first ceramic member; and
   processing the first ceramic member, the second ceramic member and the porous ceramic member to form a single ceramic body.

35. The method of claim 34, wherein the step of processing further comprises hot pressing or sintering.

36. The method of claim 34 further comprising:
   disposing one or more electrodes between the first ceramic member and the second ceramic member.

37. The method of claim 34 further comprising:
   forming one or more outlets in the first ceramic member between each blind hole and a second side of the first ceramic member.

38. The method of claim 37, wherein the step of forming one or more outlets further comprises drilling 8 to 21 holes through the first ceramic member into each blind hole.

39. The method of claim 34 further comprising coating at least a side of the second ceramic member opposite the first ceramic member with a dielectric material.

40. The method of claim 39, wherein the step of processing includes sintering or hot pressing the first ceramic member, the second ceramic member, the porous ceramic member and the dielectric material into a single ceramic body.

* * * * *

UNITED STATES PATENT AND TRADEMARK OFFICE
CERTIFICATE OF CORRECTION

PATENT NO. : 6,490,145 B1
DATED : December 3, 2002
INVENTOR(S) : Kholodenko et al.

It is certified that error appears in the above-identified patent and that said Letters Patent is hereby corrected as shown below:

Column 4,
Line 55, please change "liquidcontaining" to -- liquid-containing --.

Column 7,
Line 31, please change "blind hole may" to -- blind hold that may --.
Lines 43-44, please delete "may comprise a".

Column 10,
Lines 5-6, after "wherein the" please insert -- porous member and ceramic body are --.
Line 17, please delete the first occurrence of "wherein the".
Line 19, please delete the first occurrence of "wehrein the".

Signed and Sealed this

Sixteenth Day of September, 2003

JAMES E. ROGAN
*Director of the United States Patent and Trademark Office*